United States Patent
Hsiao et al.

(10) Patent No.: US 9,886,207 B2
(45) Date of Patent: Feb. 6, 2018

(54) MEMORY-ACCESS METHOD USING BATCH COMMAND QUEUE AND ASSOCIATED CONTROLLER

(71) Applicant: MediaTek Inc., Hsin-Chu (TW)

(72) Inventors: Chih-Hsiang Hsiao, Taipei (TW); Yun-Ching Li, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 144 days.

(21) Appl. No.: 14/737,854

(22) Filed: Jun. 12, 2015

(65) Prior Publication Data

US 2016/0077759 A1 Mar. 17, 2016

Related U.S. Application Data

(60) Provisional application No. 62/050,838, filed on Sep. 16, 2014.

(51) Int. Cl.
*G06F 12/00* (2006.01)
*G06F 13/00* (2006.01)
(Continued)

(52) U.S. Cl.
CPC .......... *G06F 3/0625* (2013.01); *G06F 3/0647* (2013.01); *G06F 3/0656* (2013.01); *G06F 3/0685* (2013.01)

(58) Field of Classification Search
CPC .... G06F 1/3203; G06F 1/3206; G06F 1/3215; G06F 1/3225; G06F 1/3234;
(Continued)

(56) References Cited

U.S. PATENT DOCUMENTS 5,507,005 A * 4/1996 Kojima ................. G06F 3/0601
710/52
5,589,830 A * 12/1996 Linz ....................... G06F 3/162
341/110
(Continued)

OTHER PUBLICATIONS

P1815/D11, Apr. 2012—IEEE Draft Standard for Electric Power Systems Communications—Distributed Network Protocol (DNP3); IEEE; May 3, 2012 (866 pages).*

(Continued)

*Primary Examiner* — Daniel C Chappell
(74) *Attorney, Agent, or Firm* — McClure, Qualey & Rodack, LLP

(57) ABSTRACT

A controller and a memory-access method for use in the controller are provided. The controller includes a sensor-processing system, and the sensor-processing system includes a memory, and a buffer, wherein the controller is coupled to an external memory and a sensor. The method includes the steps of: gathering the sensor data from the sensor and writing the gathered sensor data into the memory; writing information associated with the sensor data into the buffer; determining whether a fill level of the buffer has reached a predetermined threshold; and retrieving the sensor data from the memory and writing the retrieved sensor data to the external memory according to the information associated with the stored sensor data in the buffer when it is determined that the fill level has reached the predetermined threshold.

22 Claims, 4 Drawing Sheets

(51) Int. Cl.
*G06F 13/28* (2006.01)
*G06F 3/06* (2006.01)

(58) Field of Classification Search
CPC .... G06F 1/3237; G06F 1/3243; G06F 1/3268;
G06F 1/3275; G06F 1/3281; G06F
1/3287; G06F 3/06; G06F 3/0601; G06F
3/0602; G06F 3/0625; G06F 3/0634;
G06F 3/0646; G06F 3/0647; G06F
3/0649; G06F 3/0655; G06F 3/0656;
G06F 3/0658; G06F 3/0659; G06F
3/0668; G06F 3/067; G06F 3/0671; G06F
3/0673; G06F 3/0674; G06F 3/0676;
G06F 3/0677; G06F 3/0679; G06F 3/068;
G06F 3/0682; G06F 3/0683; G06F
3/0685; G06F 3/0686; G06F 3/0688;
G06F 3/1221; G06F 5/06; G06F 5/065;
G06F 9/50; G06F 9/5005; G06F 9/5011;
G06F 9/5016; G06F 9/5094; G06F
12/0246; G06F 12/0866; G06F 17/30147;
G06F 2003/0691; G06F 2003/0692; G06F
2003/0694; G06F 2003/0695; G06F
2003/0697; G06F 2003/0698; G11B
19/044
See application file for complete search history.

(56) References Cited

U.S. PATENT DOCUMENTS

| | | | | |
|---|---|---|---|---|
| 5,675,808 A * | 10/1997 | Gulick | ................ | H03K 23/68 713/321 |
| 7,210,004 B2 * | 4/2007 | Guha | ................ | G06F 1/3203 711/111 |
| 7,793,063 B1 * | 9/2010 | White | ................ | G11C 29/023 365/189.07 |
| 9,075,538 B2 * | 7/2015 | Fulkerson | ............ | G06F 3/0659 |
| 9,244,519 B1 * | 1/2016 | Ellis | ................ | G06F 13/38 |
| 9,477,419 B2 * | 10/2016 | Gemmeke | ............ | G06F 13/1668 |
| 2009/0279398 A1 * | 11/2009 | Altare | ............. | G11B 20/10527 369/47.5 |
| 2011/0283124 A1 * | 11/2011 | Branover | ............. | G06F 1/3203 713/323 |
| 2015/0071003 A1 * | 3/2015 | Numata | ................ | G11C 16/10 365/185.18 |
| 2016/0021617 A1 * | 1/2016 | Hsiao | ............... | H04W 52/0277 455/456.6 |
| 2016/0179686 A1 * | 6/2016 | Ju | ................ | G06F 3/0604 711/130 |
| 2016/0192120 A1 * | 6/2016 | Lin | ................ | H04L 43/065 455/41.2 |
| 2016/0299713 A1 * | 10/2016 | Lin | ................ | G06F 3/0619 |

OTHER PUBLICATIONS

An efficient code update solution for wireless sensor network reprogramming; Mazumder et al; Proceedings of the International Conference on Embedded Software; Sep. 29, 2013-Oct. 4, 2013 (10 pages).*

An event buffer flooding attack in DNP3 controlled SCADA systems; Jin et al; Proceedings of the Winter Simulation Conference; Dec. 11-14, 2011; pp. 2619-2631 (13 pages).*

* cited by examiner

MEMORY-ACCESS METHOD USING BATCH COMMAND QUEUE AND ASSOCIATED CONTROLLER

CROSS REFERENCE TO RELATED APPLICATIONS

This application claims the benefit of U.S. Provisional Application No. 62/050,838, filed on Sep. 16, 2014, the entirety of which is incorporated by reference herein.

BACKGROUND OF THE INVENTION

Field of the Invention

The invention relates to a memory-access method and associated controller, and, in particular, to a memory-access method capable of accessing a memory using a batch command queue to reduce power consumption and associated controller.

Description of the Related Art

With advances in technology, mobile devices have become more and more popular. Various sensors are built into the mobile device to detect information about the mobile device, such as speed, acceleration, orientation, temperature, proximity level, or ambient light. The sensor data from the sensors are usually buffered in a high-speed low-power local memory (e.g. SRAM) of the sensor-processing system in a conventional mobile device. Because of the limited size of the local memory, the sensor-processing system may utilize the system memory (e.g. DRAM) to store the sensor data due to its large size and low cost. However, the system memory should always be turned on due to frequent accessing of data in the system memory to store the sensor data, resulting in higher power consumption by the conventional mobile device.

Accordingly, there is a demand for a controller and associated memory-access method to solve the aforementioned issue.

BRIEF SUMMARY OF THE INVENTION

A detailed description is given in the following embodiments with reference to the accompanying drawings.

A controller is provided. The controller comprises: a sensor-processing system, comprising: a memory; a buffer; and a processor, configured to gather the sensor data from at least one sensor, store the sensor data into the memory, and write information associated with the stored sensor data in the buffer; and a control unit, configured to determine whether a fill level of the buffer has reached a predetermined threshold, wherein when the control unit determines that the fill level has reached the predetermined threshold, the controller retrieves the sensor data from the memory and writes the retrieved sensor data to an external memory according to the information associated with the stored sensor data in the buffer.

A memory-access method for use in a controller is provided. The controller comprises a sensor-processing system, and the sensor-processing system comprises a memory, and a buffer, wherein the controller is coupled to an external memory and a sensor. The method includes the steps of: gathering the sensor data from the sensor and writing the gathered sensor data into the memory; writing information associated with the sensor data into the buffer; determining whether a fill level of the buffer has reached a predetermined threshold; and retrieving the sensor data from the memory and writing the retrieved sensor data to the external memory according to the information associated with the stored sensor data in the buffer when it is determined that the fill level has reached the predetermined threshold.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

This description is made for the purpose of illustrating the general principles of the invention and should not be taken in a limiting sense. The scope of the invention is best determined by reference to the appended claims.

Figure 1:
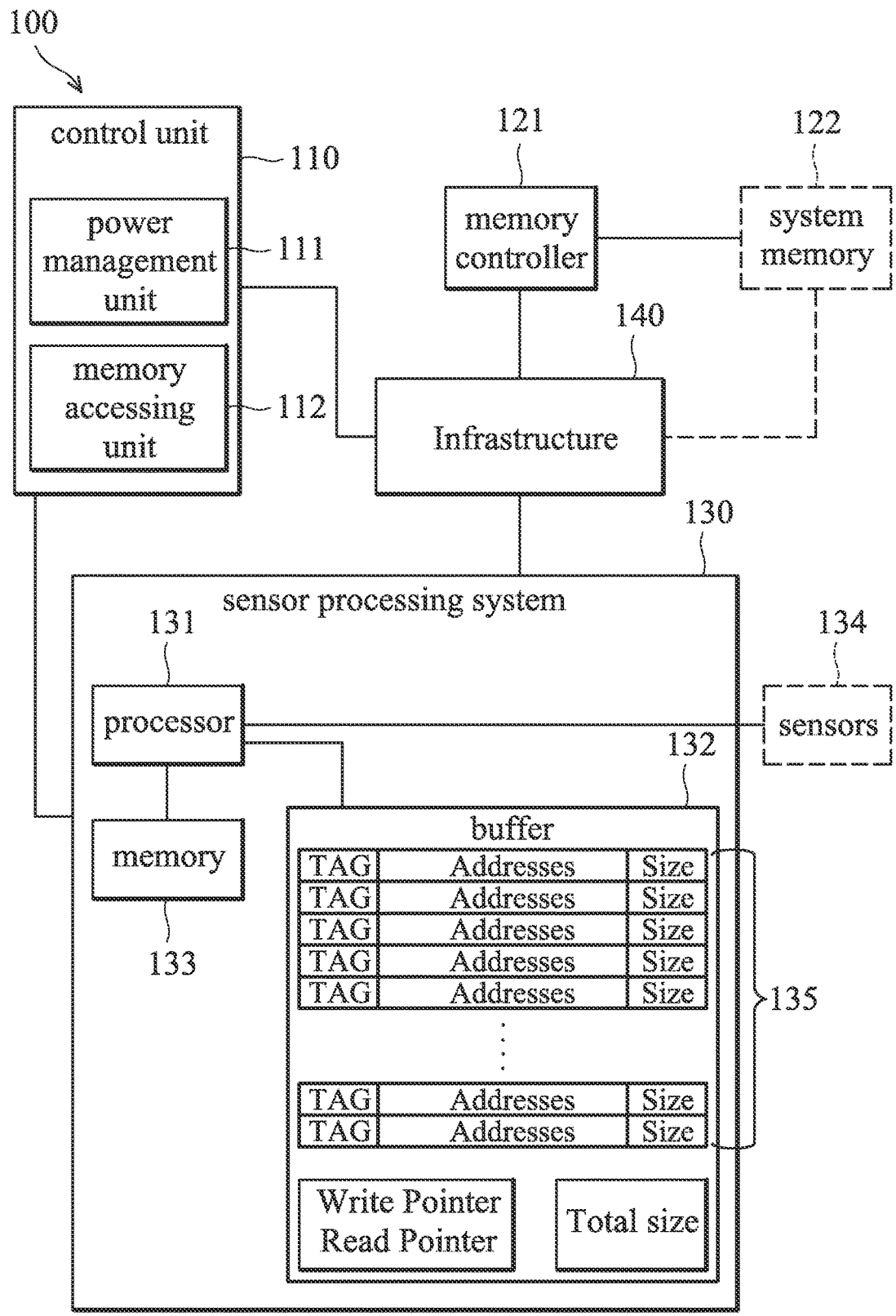
FIG. 1 is a block diagram of a controller in accordance with an embodiment of the invention.

FIG. 1 is a block diagram of a controller in accordance with an embodiment of the invention. The controller 100 comprises a control unit 110, a memory controller 121, a sensor-processing system 130, and an infrastructure 140. The control unit 110 is configured to control the power status of an external memory 122 and the infrastructure 140, where the external memory 122 is a system memory external to the controller 100, and may be a dynamic random access memory, but the invention is not limited thereto. The control unit 110, for example, may be a central processing unit (CPU), a digital signal processor (DSP), a general-purpose processor, a microcontroller, an application-specific integrated circuit (ASIC), and the like. In addition, the control unit 110 is further configured to detect whether to write the sensor data from the sensor-processing system 130 to the external memory 122, and the details will be described later. In an embodiment, the control unit 110, the sensor-processing system 130, and the infrastructure 140 can be integrated into a system-on-chip (SoC).

The memory controller 121 is configured to control data-access to the external memory 122. The infrastructure 140 is an intermediary communicating between the external memory 122 and the sensor-processing system 130. In some embodiments, the infrastructure 140 can be implemented by a system bus.

The sensor-processing system 130 comprises a processor 131, a buffer 132, and, a memory 133. In an embodiment, The processor 131 gathers the sensor data from a plurality of sensor 134 and stores the gathered sensor data in the memory 133 such as a static random access memory (SRAM) or a tightly-coupled memory (TCM), where the sensors 134 are external to the controller 100, and are configured to detect different conditions in the environment, such as speed, acceleration, orientation, temperature, proximity level, and/or ambient light of the controller 100, but the invention is not limited thereto. Thus, the processor 131 may access the sensor data in the memory 133 at high speed and low power consumption. For example, the processor 131 can be implemented by a processor or a microcontroller.

In addition, the processor 131 further records the information associated with the stored sensor data in the buffer 132. For example, the information associated with each piece of the stored sensor data may be a tag (e.g. a write/read flag), the read memory address for each written data in the memory 133, the write address where the stored sensor data is to be written into the external memory 122, and the size of each piece of stored sensor data. In addition, the buffer 132 also records the write pointer, read pointer, and the total size of the stored sensor data, and the processor 131 also stores a batch command queue 135, which buffers incoming data-access requests or commands of the external memory 122, into the buffer 132, as shown in FIG. 1.

In an embodiment, the control unit 110 comprises a power-management unit 111 and a memory accessing unit 112. The power-management unit 111 is configured to control power status of the external memory 122 through the infrastructure 140. The memory accessing unit 112 is configured to monitor the status (e.g. the fill level) of the batch command queue 135 in the buffer 132, and control data-access of the sensor data stored in the memory 133

In an embodiment, since the size of the buffer (local memory) 132 may be not sufficient to buffer the gathered sensor data for some applications, the processor 131 is further capable of accessing the data stored in the external memory 122 through the infrastructure 140. However, the operation of the external memory 122 by the processor 131 consumes much power. The power-management unit 111 may turn off the power to the external memory 122 through the infrastructure 140 when the memory accessing unit 112 determines that the fill level of the batch command queue 135 in the buffer 132 has not reached the predetermined threshold, thereby reducing power consumption of the controller 100. In an embodiment, the power management unit 111 turns off the power to the external memory 122 directly through the infrastructure 140. Alternatively, the power management unit 111 turns off the power to the external memory 122 through the infrastructure 140 and the memory controller 121.

Specifically, when the spare space of the memory 133 is sufficient for storing the gathered sensor data or data, the memory accessing unit 112 may buffer the data-access requests of the gathered sensor data as a batch command queue 135 in the buffer 132, and it is indicative of that the power to the external memory 122 can be turned off temporarily to reduce power consumption. In order to improve efficiency, the memory accessing unit 112 may also buffer the sensor data to a predetermined level, and then write the buffered sensor data to the external memory 122 in the batch command queue 135 through the infrastructure 140. It should be noted that the predetermined threshold is programmable.

When the memory accessing unit 112 determines that the fill level of the batch command queue 135 in the buffer 132 has reached the predetermined threshold, the memory accessing unit 112 firstly informs the power-management unit 111 to turn on the power to the external memory 122 through the infrastructure 140, and retrieves the sensor data from the memory 133 and associated information from the buffer 132. The memory-accessing unit 112 then transmits the retrieved sensor data to the external memory 122 through the infrastructure 140, so that the memory controller 121 is capable of writing the retrieved sensor data into the external memory 122 based on the associated information (e.g. destination memory address).

It should be noted that the requests in the command queue are not limited to write requests or read requests only. Similarly, the memory accessing unit 112 is also capable of reading data from the external memory 122 through the infrastructure 140. The memory accessing unit 112 may analyze the requests in the command queue and then determine whether to read data from the memory 133 or the external memory 122. Specifically, the information associated with each piece of stored sensor data in the buffer 132 records the write/read memory address in the memory 133 and the write/read memory address in the external memory 122. The memory accessing unit 112 may retrieve data from the memory 133 or the external memory 122 based on the recorded address information in the buffer 132, and then transmit the retrieved data to the associated address of the memory 133 or the external memory 122.

Figure 2A:
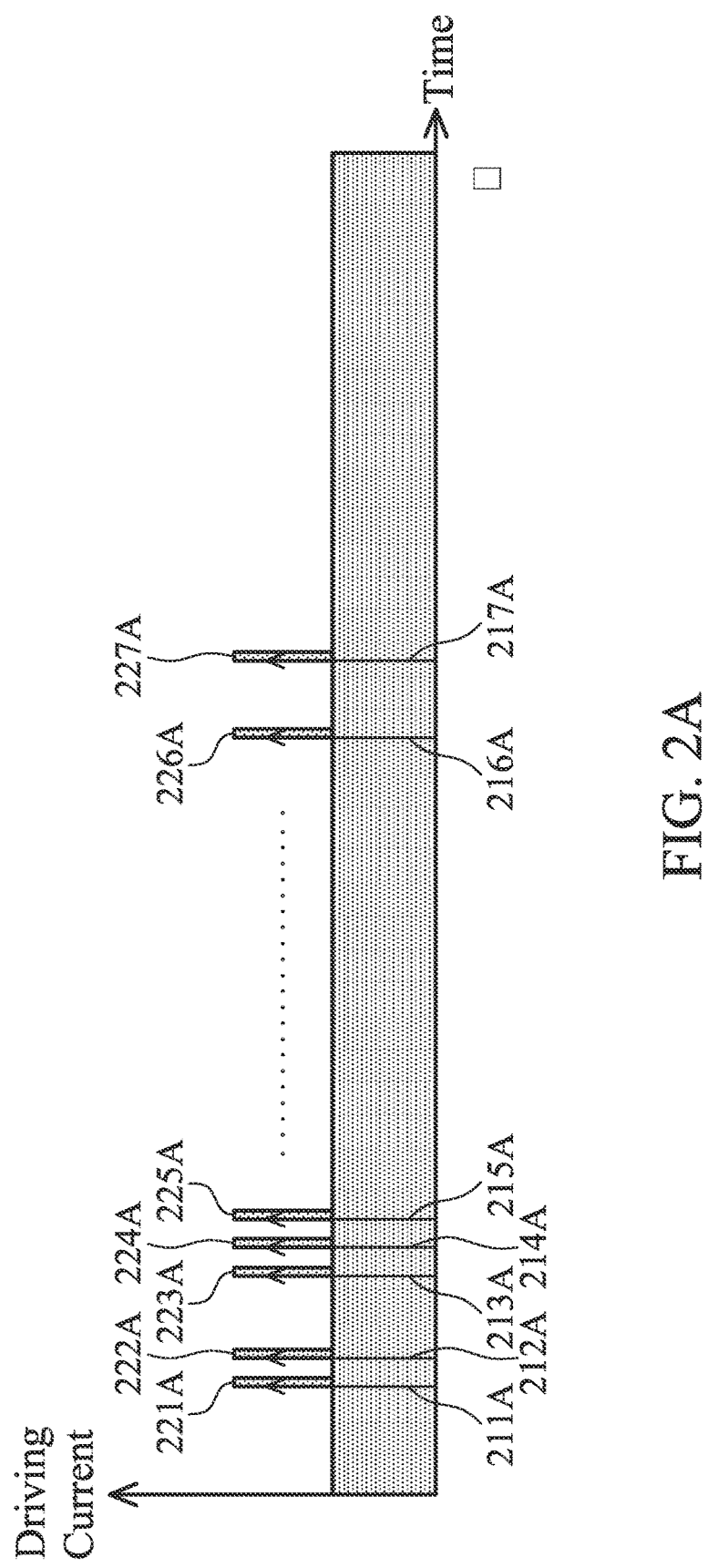
FIG. 2A is a diagram illustrating the driving current of the controller without the batch command queue in accordance with an embodiment of the invention.
Figure 2B:
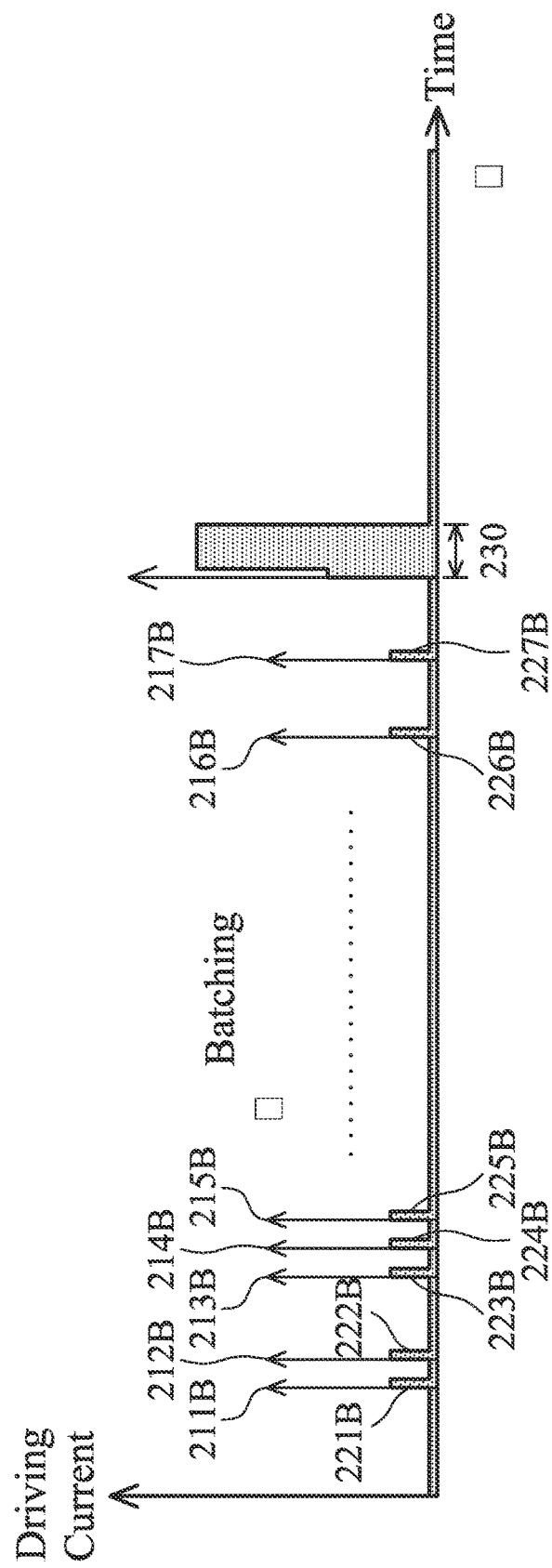
FIG. 2B is a diagram illustrating the driving current of the controller using the batch command queue in accordance with an embodiment of the invention.

FIG. 2A is a diagram illustrating the driving current of the integrated circuit without the batch command queue in accordance with an embodiment of the invention. FIG. 2B is a diagram illustrating the driving current of the integrated circuit using the batch command queue in accordance with an embodiment of the invention. In an embodiment, the memory accessing unit 112 is also capable of performing each data-access request to the external memory 122 without using a batch command queue. In this situation, the power to the memory module 120 should be always turned on. As shown in FIG. 2A, each arrow (e.g. 211A-217A) indicates a data-access request and each associated peak (e.g. peaks 221A-227A) indicates the active driving current of the memory 133 plus that of the external memory 122. Accordingly, the total driving current of the controller 100 is almost maintained at a certain level (e.g. the active driving current of the external memory 122), resulting in higher power consumption.

When the batch command queue 135 is applied, the power to the external memory 122 is only turned on upon need. As shown in FIG. 2B, each arrow (e.g. 211B~217B) indicates an individual data-access request and each associated peak (e.g. peaks 221B~227B) indicate the active driving current of the memory 133. Accordingly, the total driving current of the controller 100 can be maintained at a very low level when gathered sensor data and associated data-access requests are buffered. When the external memory 122 is turned on to process the batch command queue, the driving current of the controller 100 reaches a higher level for a short time period (e.g. period 230). After writing data associated with the batch command queue, the memory accessing unit 112 informs the power-management unit 121 to turn off the power to the external memory 122 (e.g. entering a sleep mode) to reduce power consumption. Accordingly, with the batch memory accessing mechanism provided in the invention, the overall power consumption of the controller can be reduced effectively.

Figure 3:
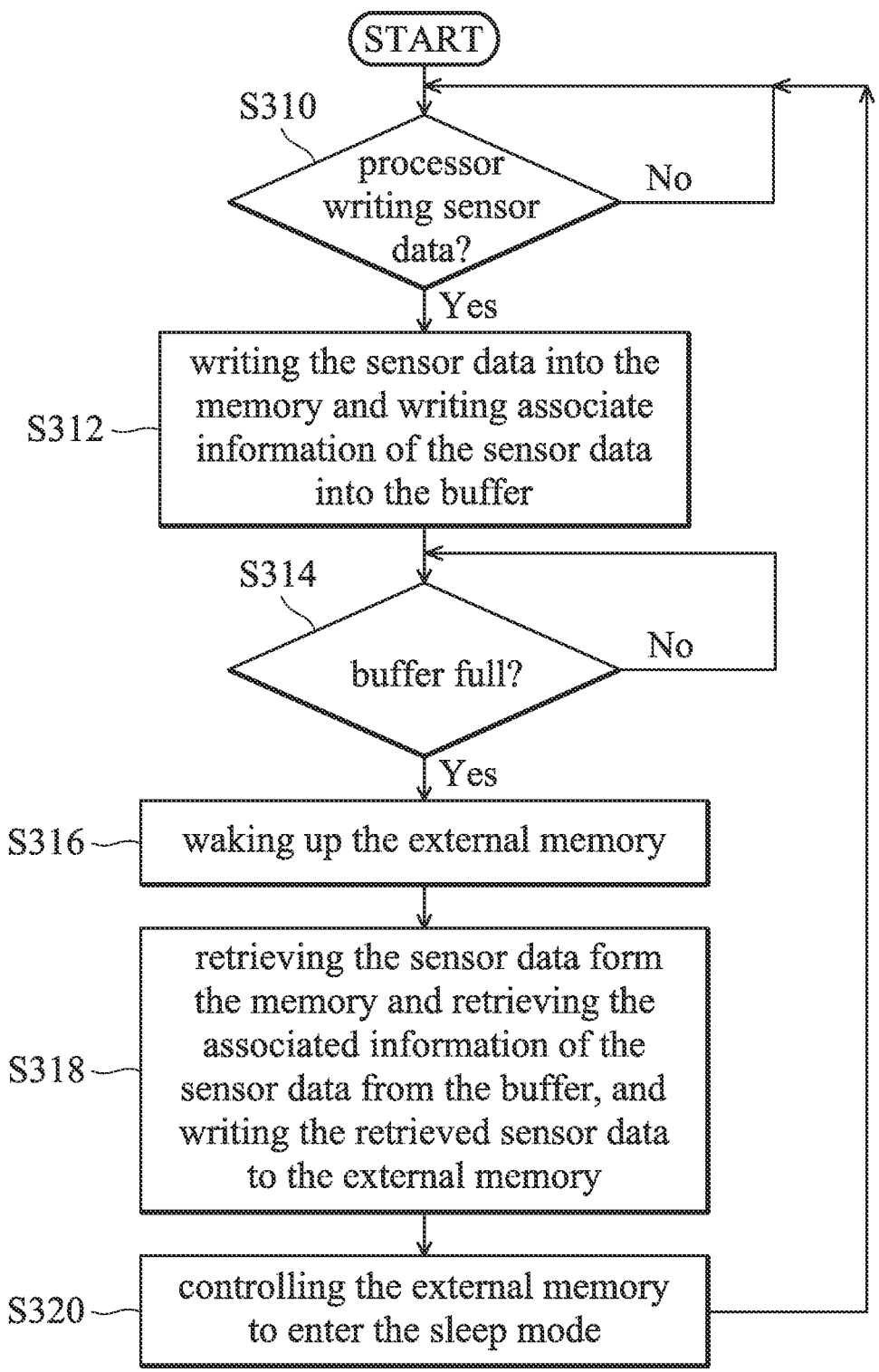
FIG. 3 is a flow chart of the memory-access method in accordance with an embodiment of the invention.

FIG. 3 is a flow chart of the memory-access method in accordance with an embodiment of the invention. In step S310, it is determined whether the processor 131 writes sensor data from the sensor 134. If so, the processor 131 writes the data into the buffer 132 (step S312). Otherwise, step S310 is performed. In step S314, the memory accessing unit 112 determines whether the fill level of the buffer 132 has reached a predetermined threshold. If it is determined that the fill level of the buffer 132 has reached the predetermined threshold, step S316 is performed. If it is determined that the fill level of the buffer 132 has not reached the predetermined threshold, step S314 is performed. In step S316, the memory accessing unit 112 informs the power-management unit 111 to wake up the external memory 122. In step S318, the memory accessing unit 112 retrieves the sensor data from the memory 133 according to the recorded information (e.g. the source/destination memory address) in the buffer 132, and writes the retrieved sensor data to the external memory 112. Upon completion of the writing operation, the memory accessing unit 122 informs the power management module 121 to turn off the power to the external memory 122 through the infrastructure 140 (e.g. the external memory 122 enters the sleep mode) (step S320).

In view of the above, a controller and associated memory-access method are provided. The controller and the associated memory-access method are capable of writing the data-access requests in a batch command queue in the buffer and storing the sensor data associated with the data-access request in a memory of the sensor-processing system. The external memory (e.g. DRAM) of the controller can be turned off when the fill level of the buffer has not reached the predetermined threshold. In addition, the stored sensor data in the memory can be written into the external memory in a batch when the fill level of the buffer has reached the predetermined threshold. Accordingly, the power consumption of accessing the external memory can be significantly reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A controller, comprising:
   a sensor-processing system, fabricated in a single integrated circuit for use in a portable device, comprising:
   a memory;
   a buffer; and
   a processor, configured to gather sensor data from at least one sensor, store the sensor data into the memory, and write information associated with the stored sensor data in the buffer; and
   a control unit, configured to determine whether a fill level of the buffer has reached a predetermined threshold, wherein when the control unit determines that the fill level has reached the predetermined threshold, the controller retrieves the sensor data from the memory and writes the retrieved sensor data and the information associated with the stored sensor data to an external volatile memory according to the information associated with the stored sensor data in the buffer wherein the control unit comprises a power management unit that controls a power status of the external volatile memory such that the power management unit turns off the external volatile memory when the fill level is below the predetermined threshold, and such that the power management unit turns on the external volatile memory when the fill level exceeds the predetermined threshold.

2. The controller as claimed in claim 1, wherein the predetermined threshold is programmable.

3. The controller as claimed in claim 1, further comprising:
   a memory controller for controlling access to the external volatile memory; and
   an infrastructure communicating between the memory controller and the sensor-processing system,
   wherein the control unit transmits the retrieved sensor data and the information associated with the retrieved sensor data to the memory controller through the infrastructure, and the memory controller writes the retrieved sensor data into the external volatile memory according to the information associated with the retrieved sensor data.

4. The controller as claimed in claim 3, wherein the information associated with the sensor data comprises a first memory address where the sensor data is stored in the memory.

5. The controller as claimed in claim 4, wherein the information further comprises a tag and a size of each piece of the sensor data.

6. The controller as claimed in claim 4, wherein the control unit further writes pointer information associated with the sensor data, and a total size of the sensor data in the buffer.

7. The controller as claimed in claim 4, wherein the control unit further writes each data-access request corresponding to the sensor data into a batch command queue in the buffer, and the control unit retrieves the batch command queue and transmits the batch command queue to the memory controller when the controller determines that the fill level has reached the predetermined threshold.

8. The controller as claimed in claim 4, wherein the external volatile memory is a system memory of the portable device.

9. The controller as claimed in claim 6, wherein the external volatile memory is a system memory of the portable device, and the control unit further turns off power to the external volatile memory and the infrastructure upon completion of writing the sensor data to the external volatile memory.

10. The controller as claimed in claim 1, wherein the external volatile memory enters a sleep mode and the sleep mode is a data-retention mode.

11. The controller as claimed in claim 1, wherein the external volatile memory enters a sleep mode and the sleep mode is a self-refresh mode.

12. The controller as claimed in claim 1, wherein the control unit actively writes the retrieved sensor data to the external volatile memory according to the information associated with the stored sensor data in the buffer when it is determined that the fill level of the buffer has reached the predetermined threshold.

13. A memory-access method for use in a controller, wherein the controller comprises a sensor-processing system fabricated in a single integrated circuit for use in a portable device, and the sensor-processing system comprises a memory, and a buffer, wherein the controller is coupled to an external volatile memory and a sensor, the method comprising:
   gathering sensor data from the sensor and writing the gathered sensor data into the memory;
   writing information associated with the sensor data into the buffer;
   determining whether a fill level of the buffer has reached a predetermined threshold; and
   retrieving the sensor data from the memory and writing the retrieved sensor data and the information associated with the stored sensor data to the external volatile memory according to the information associated with the stored sensor data in the buffer when it is determined that the fill level has reached the predetermined threshold wherein the controller comprises a power management unit that controls a power status of the external volatile memory such that the power management unit turns off the external volatile memory when the fill level is below the predetermined threshold, and such that the power management unit turns on the external volatile memory when the fill level exceeds the predetermined threshold.

14. The memory-access method as claimed in claim 13, wherein the predetermined threshold is programmable.

15. The memory-access method as claimed in claim 13, wherein the controller further comprises a memory controller for controlling access to the external volatile memory, and an infrastructure communicating between the memory controller and the sensor-processing system, and the method further comprises:
   transmitting the retrieved sensor data and the information associated with the retrieved sensor data to the memory controller through the infrastructure;
   writing the retrieved sensor data into the external volatile memory according to the information associated with the retrieved sensor data by the memory controller.

16. The memory-access method as claimed in claim 15, wherein the external volatile memory is a system memory of the portable device.

17. The memory-access method as claimed in claim 16, wherein the external volatile memory is a system memory of the portable device, and the method further comprises:
   turning off power to the external volatile memory and the infrastructure upon completion of writing the sensor data to the external volatile memory.

18. The memory-access method as claimed in claim 13, wherein the information associated with the sensor data comprises a first memory address where the sensor data is stored in the memory.

19. The memory-access method as claimed in claim 13, wherein the information further comprises a tag and a size of each piece of the sensor data.

20. The memory-access method as claimed in claim 13, further comprising:
   writing pointer information of the sensor data, and the total size of the sensor data in the buffer.

21. The memory-access method as claimed in claim 13, further comprising:
   writing each data-access request corresponding to the sensor data into a batch command queue in the buffer; and
   retrieving the batch command queue and transmitting the batch command queue to the memory controller when it is determined that the fill level has reached the predetermined threshold.

22. The method as claimed in claim 13, further comprising:
   actively writing the retrieved sensor data to the external volatile memory according to the information associated with the stored sensor data in the buffer when it is determined that the fill level of the buffer has reached the predetermined threshold.

* * * * *